United States Patent
Sato et al.

(10) Patent No.: US 9,923,012 B2
(45) Date of Patent: Mar. 20, 2018

(54) IMAGE PICKUP APPARATUS AND RADIATION IMAGE PICKUP SYSTEM

(71) Applicant: CANON KABUSHIKI KAISHA, Tokyo (JP)

(72) Inventors: Kanako Sato, Yokohama (JP); Kazumasa Matsumoto, Yokohama (JP); Katsuro Takenaka, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 194 days.

(21) Appl. No.: 14/877,350

(22) Filed: Oct. 7, 2015

(65) Prior Publication Data

US 2016/0104733 A1    Apr. 14, 2016

(30) Foreign Application Priority Data

Oct. 9, 2014    (JP) ................................ 2014-208407

(51) Int. Cl.
| | |
|---|---|
| H01L 27/00 | (2006.01) |
| H01L 27/146 | (2006.01) |
| H04N 5/32 | (2006.01) |
| H04N 5/355 | (2011.01) |
| H04N 5/378 | (2011.01) |

(52) U.S. Cl.
CPC ......... *H01L 27/14643* (2013.01); *H04N 5/32* (2013.01); *H04N 5/3559* (2013.01); *H04N 5/378* (2013.01)

(58) Field of Classification Search
CPC ... H04N 5/3559; H04N 5/37452; H04N 5/355
See application file for complete search history.

(56) References Cited

U.S. PATENT DOCUMENTS 5,471,515 A * 11/1995 Fossum ................ G11C 19/282
257/239

FOREIGN PATENT DOCUMENTS

| JP | 2002-344809 A | 11/2002 |
|---|---|---|
| JP | 2011-525983 A | 9/2011 |

* cited by examiner

*Primary Examiner* — Thanh Luu
(74) *Attorney, Agent, or Firm* — Canon U.S.A., Inc. IP Division

(57) ABSTRACT

An image pickup apparatus includes a pixel array including a plurality of pixels arranged in a two-dimensional pattern, each of which includes a conversion unit, an amplification unit, a first holding unit configured to hold a first signal obtained by the amplification unit amplifying an electric charge converted by the conversion unit having a first sensitivity, a second holding unit configured to hold a second signal obtained by the amplification unit amplifying the electric charge converted by the conversion unit having a second sensitivity different from the first sensitivity, and a third holding unit configured to hold an offset signal of the amplification unit, and a correction unit configured to correct the first signal using a second output signal output from the second holding unit or a first output signal output from the first holding unit, and a third output signal output from the third holding unit.

18 Claims, 10 Drawing Sheets

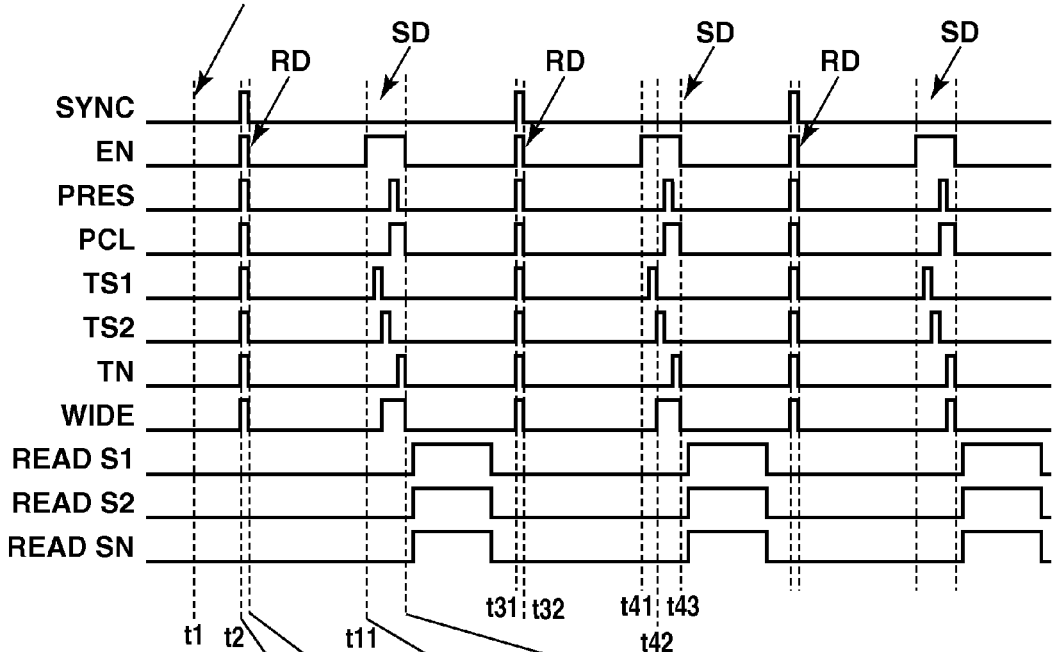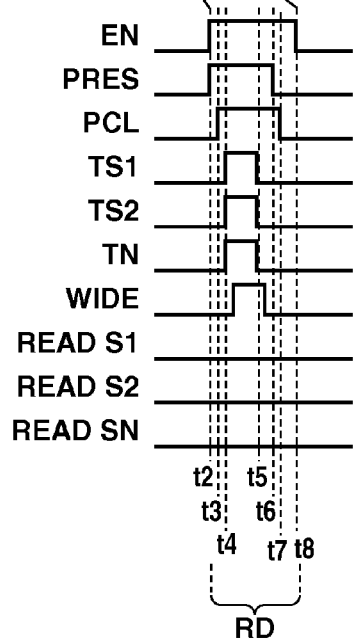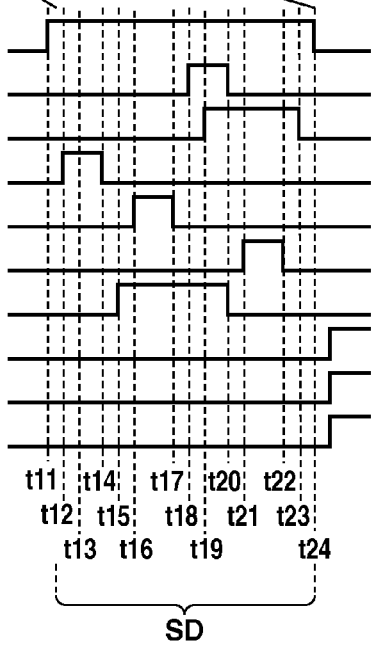

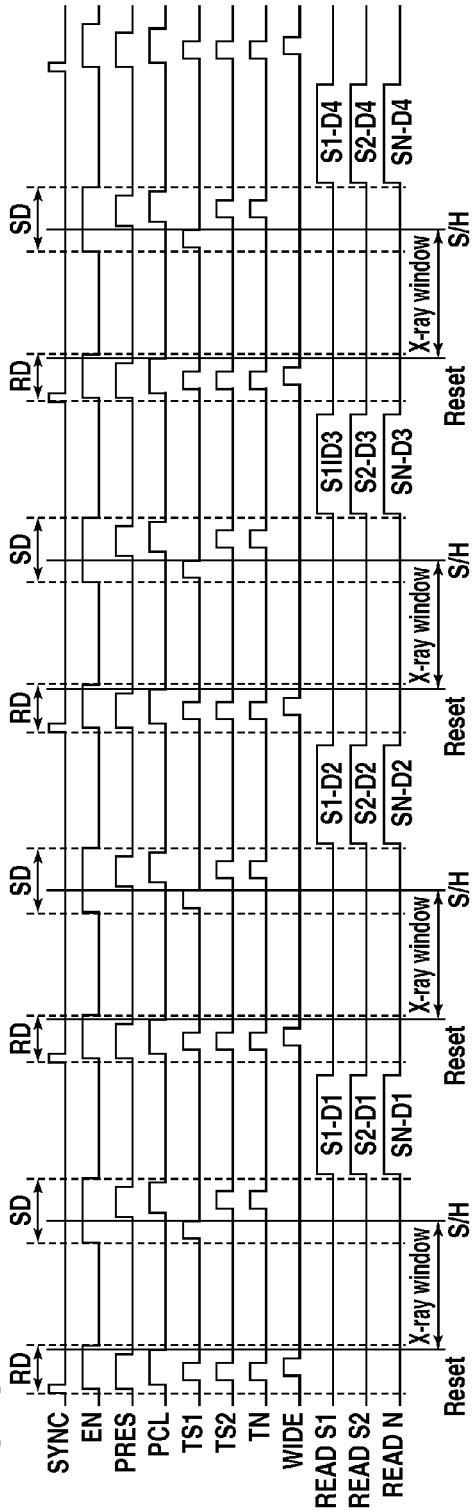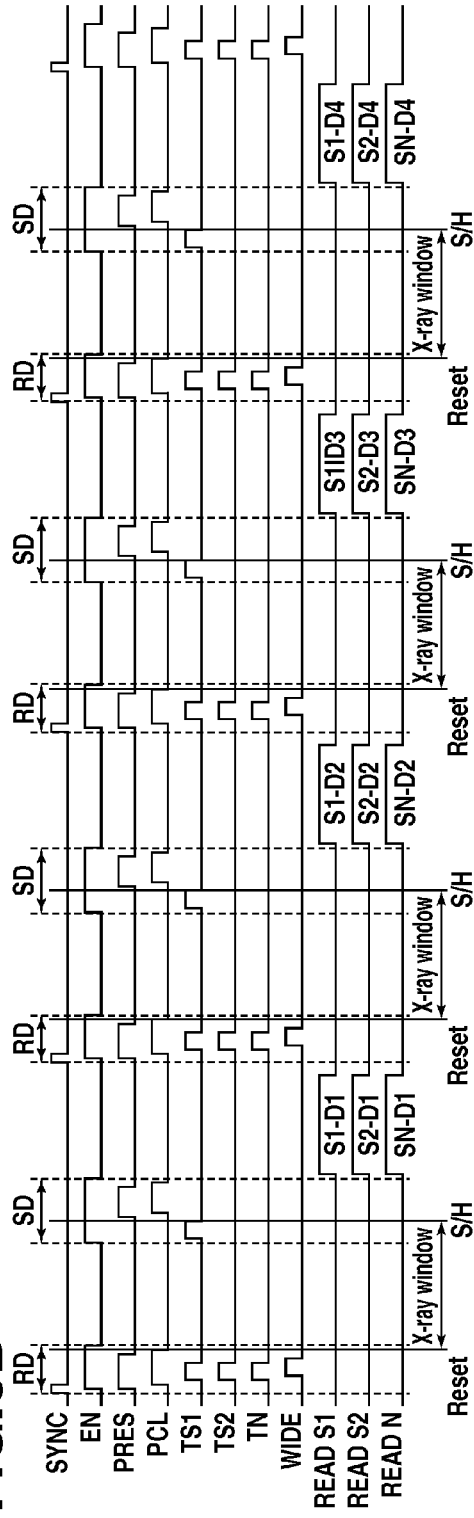

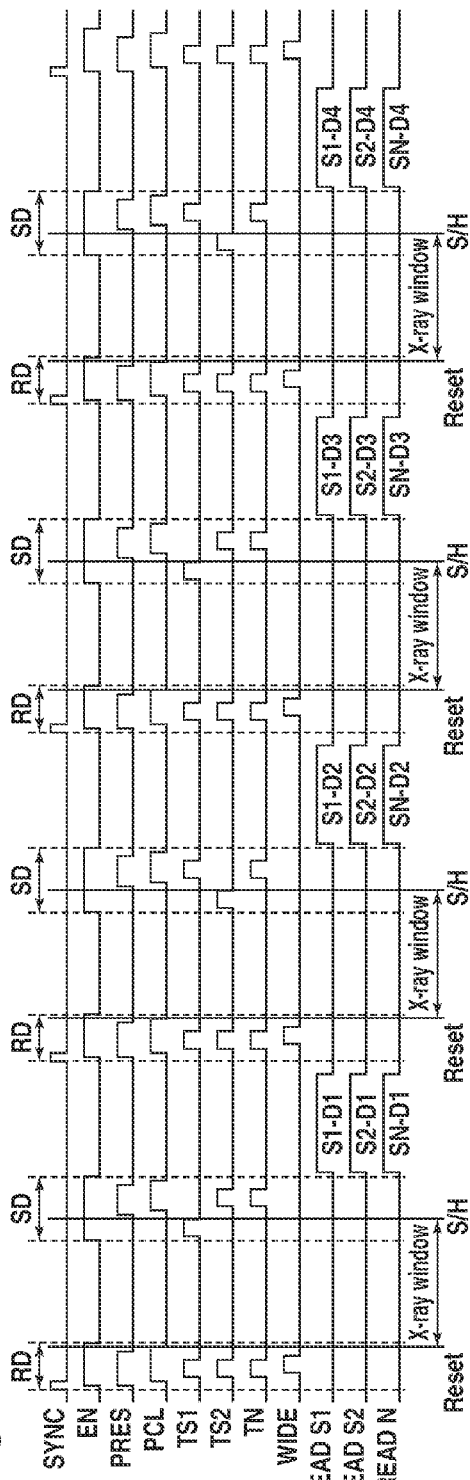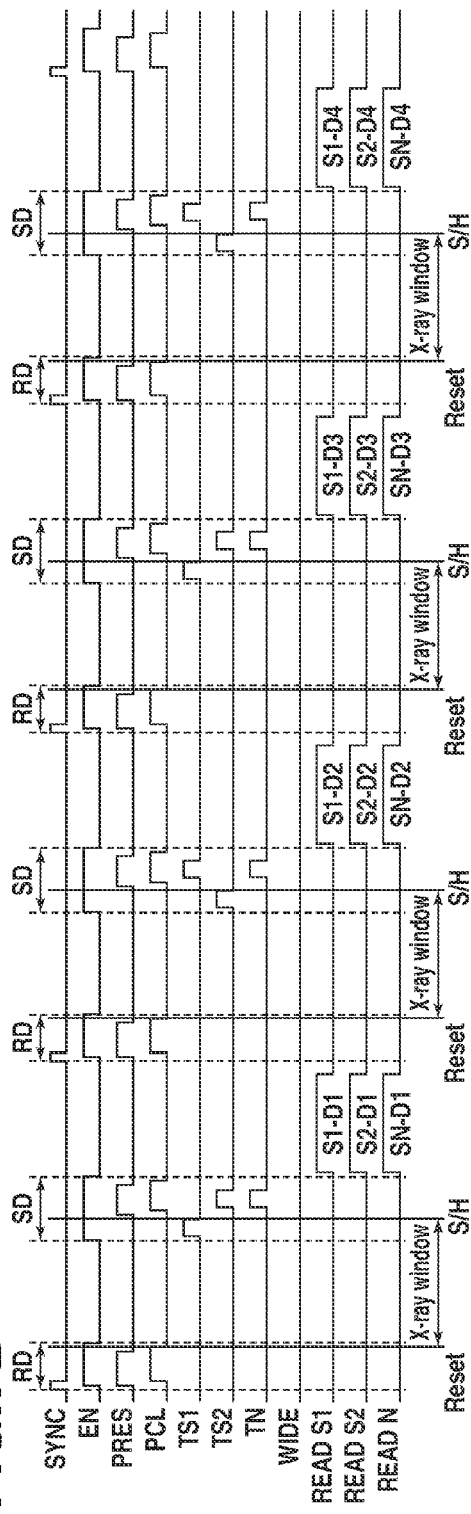

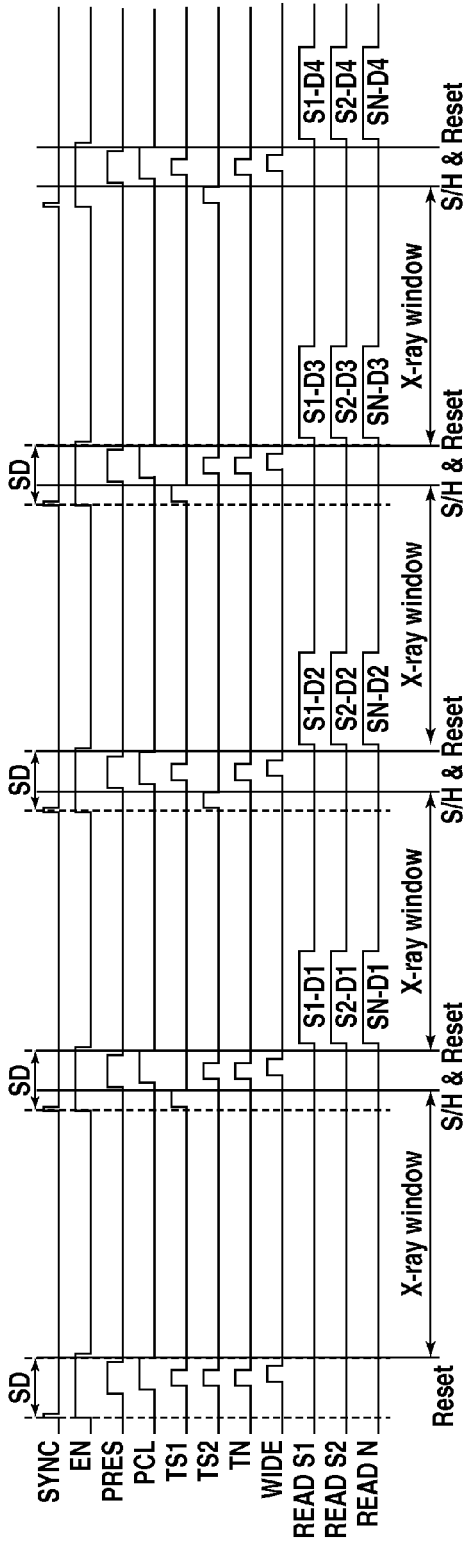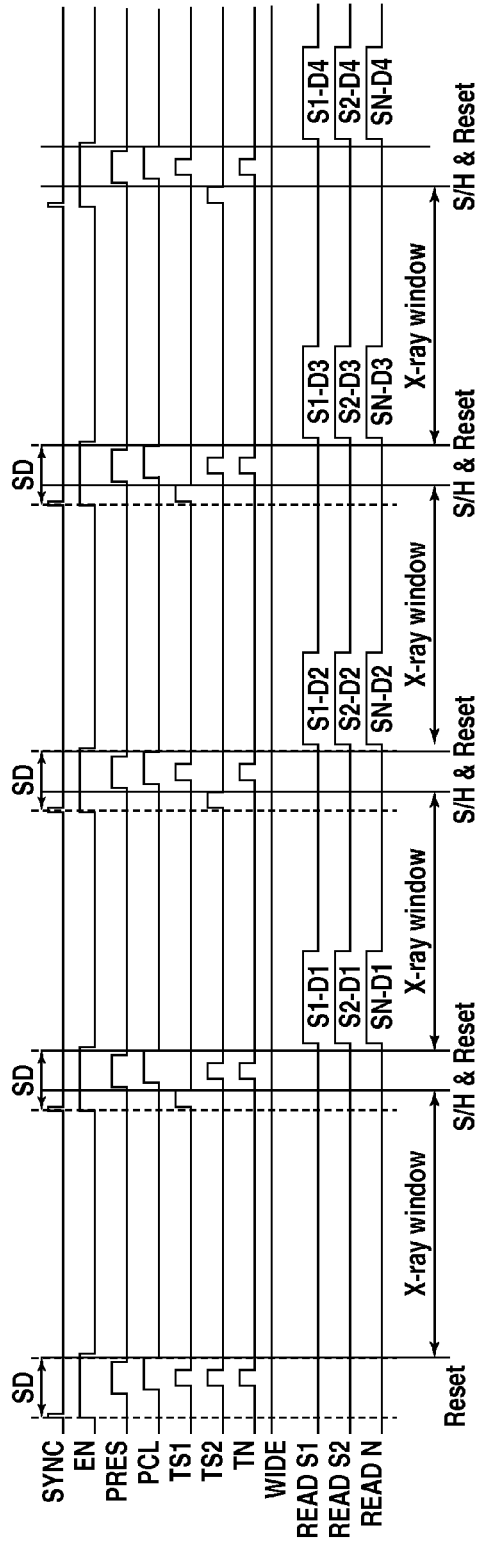

IMAGE PICKUP APPARATUS AND RADIATION IMAGE PICKUP SYSTEM

BACKGROUND OF THE INVENTION

Field of the Invention

The present invention relates to an image pickup apparatus and a radiation image pickup system.

Description of the Related Art

As discussed in Japanese Patent Application Laid-Open No. 2002-344809, there is a radiation image pickup apparatus including a holding unit (a sample and hold circuit) that holds a signal indicating the amount of radiation used to irradiate each pixel of a sensor array (hereinafter, referred to as "signal S"). As discussed in Japanese Patent Application Laid-Open No. 2002-344809, the signal S indicating the radiation amount can be individually held by a first holding unit via an amplification unit in each pixel. Therefore, reading a signal from one frame and performing radiation exposure for the next frame can be performed simultaneously. Further, according to Japanese Patent Application Laid-Open No. 2002-344809, a second holding unit is provided to hold a signal representing a noise component (e.g., offset) generated by the amplification unit (hereinafter, referred to as "noise signal SN"). Further, according to Japanese Patent Application Laid-Open No. 2002-344809, it is possible to perform processing for reducing the noise component from the signal S held by the first holding unit (e.g. correlated double sampling (CDS) processing).

On the other hand, as discussed in Japanese Unexamined Patent Application Publication (Translation of PCT Application) No. 2011-525983, there is a conventional image pickup apparatus that acquires signals, for example, at two sensitivity levels (hereinafter, referred to as signals S1 and S2) in each pixel and generates image data using these signals S1 and S2. According to the technique discussed in Japanese Unexamined Patent Application Publication (Translation of PCT Application) No. 2011-525983, two holding units are provided in each pixel so that the signals S1 and S2 obtained at respective sensitivity levels can be held in respective holding units and can be individually read.

However, in each of Japanese Patent Application Laid-Open No. 2002-344809 and Japanese Unexamined Patent Application Publication (Translation of PCT Application) No. 2011-525983, it may be difficult to sufficiently reduce a noise signal N from the signal S of each pixel. In each of Japanese Patent Application Laid-Open No. 2002-344809 and Japanese Unexamined Patent Application Publication (Translation of PCT Application) No. 2011-525983, each pixel has a complicated configuration. Therefore, the influence of heat generated by the amplification unit imparted on each holding unit will be variable depending on an internal layout of the pixel. The noise component influencing the signal component held by each holding unit will be differentiated. The noise component is variable depending on the temperature. Therefore, in such a case, there is a difference between the noise component included in the signal S and the noise component included in the noise signal SN, and thus it may be difficult to sufficiently reduce the noise component from the signal S.

SUMMARY OF THE INVENTION

In view of the foregoing, the present invention intends to provide a technique advantageous in reducing the noise components arising in each pixel of the image pickup apparatus. According to an aspect of the present invention, an image pickup apparatus includes a pixel array including a plurality of pixels arranged in a two-dimensional pattern, each of which includes a conversion unit configured to convert radiation or light into an electric charge, an amplification unit configured to amplify the electric charge, a first holding unit configured to hold a first signal obtained by the amplification unit amplifying the electric charge converted by the conversion unit having a first sensitivity, a second holding unit configured to hold a second signal obtained by the amplification unit amplifying the electric charge converted by the conversion unit having a second sensitivity different from the first sensitivity, and a third holding unit configured to hold an offset signal of the amplification unit, and a correction unit configured to correct the first signal using a second output signal output from the second holding unit or a first output signal output from the first holding unit, and a third output signal output from the third holding unit.

Further features of the present invention will become apparent from the following description of exemplary embodiments with reference to the attached drawings.

BRIEF DESCRIPTION OF THE DRAWINGS

FIGS. 4A, 4B, and 4C are timing charts illustrating an operational mode of an image pickup apparatus according to an exemplary embodiment that performs dynamic range expansion.

FIGS. 6A, 6B, and 6C illustrate timing charts illustrating processing according to a first exemplary embodiment, which can be realized by an image pickup apparatus according to an exemplary embodiment.

FIGS. 7A, 7B, and 7C are timing charts illustrating processing according to a second exemplary embodiment, which can be realized by an image pickup apparatus according to an exemplary embodiment.

FIGS. 8A and 8B are timing charts illustrating processing according to the second exemplary embodiment, which can be realized by an image pickup apparatus according to an exemplary embodiment.

DESCRIPTION OF THE EMBODIMENTS

Figure 1:
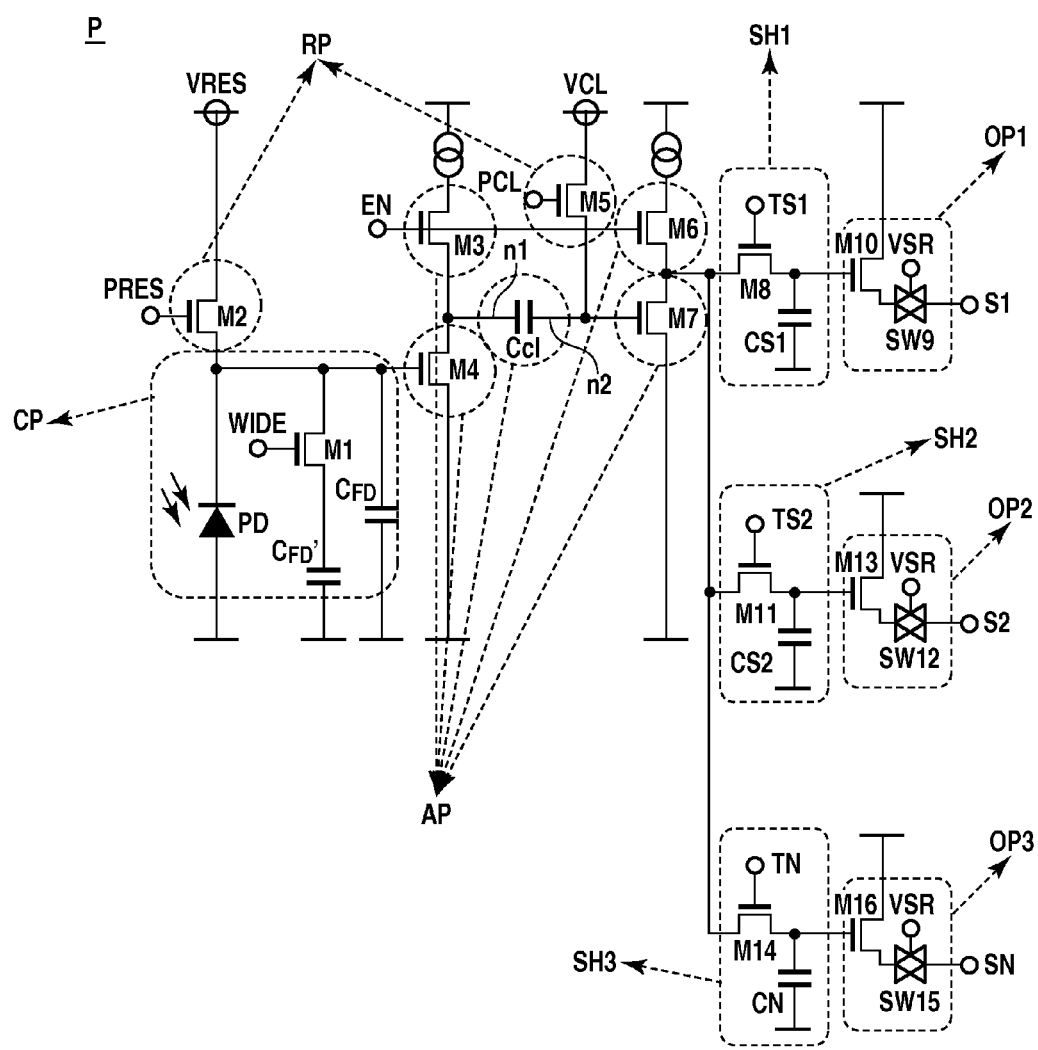
FIG. 1 is a schematic equivalent circuit diagram illustrating one pixel of an image pickup apparatus according to an exemplary embodiment.

An image pickup apparatus according to an exemplary embodiment of the present invention includes a pixel array including a plurality of pixels arranged in a two-dimensional pattern and a correction unit configured to correct a signal output from the pixel array. Each of the plurality of pixels includes a conversion unit, an amplification unit, a first holding unit, a second holding unit, and a third holding unit. The conversion unit is capable of converting radiation or light into an electric charge. The amplification unit is capable of amplifying the electric charge output from the conversion unit. The first holding unit is capable of holding a first signal obtainable when the electric charge is converted by the conversion unit having a first sensitivity is amplified by the amplification unit. The second holding unit is capable of holding a second signal obtainable when the electric charge converted by the conversion unit having a second sensitivity, which is different from the first sensitivity, is amplified by the amplification unit. More specifically, the first holding unit and the second holding unit are functionally operable as a signal holding unit capable of holding a signal obtainable when the electric charge converted by the conversion unit is amplified by the amplification unit. Further, the third holding unit is capable of holding an offset signal of the amplification unit. According to the above-mentioned configuration, for example, if a distance from the amplification unit to the first holding unit and the second holding unit is different from a distance from the amplification unit to the third holding unit, there will be a possibility that heat generated by the amplification unit causes temperature influence that is different in each of the first holding unit, the second holding unit, and the third holding unit. In general, noise components are variable depending on the temperature. In the above-mentioned case, there will be differences between noise components included in the signal held and output by the first holding unit or the second holding unit and noise components included in the signal held and output by the third holding unit. Accordingly, if the correction is performed based on only the signal held and output by the third holding unit, it may be difficult to reduce noise components sufficiently. Therefore, the correction unit performs a correction in such a way as to reduce differences between noise components included in the signal held by a signal holding unit and noise components included in the signal held by the offset holding unit. The differences in noise components derive from a difference between a distance from the amplification unit to the signal holding unit and a distance from the amplification unit to the offset holding unit. Further, the differences in noise components derive from a difference in heat influence between heat generated by the amplification unit of the signal holding unit and heat generated by the amplification unit of the offset holding unit. More specifically, to correct the first signal held by the first holding unit, the correction unit uses not only a third output signal output from the third holding unit but also a second output signal output from the second holding unit or a first output signal output from the first holding unit. Accordingly, it becomes possible to realize the correction capable of reflecting the temperature dependency of noise components because there are many signals available in the correction. As a result, it becomes possible to provide a technique advantageous in reducing noise components having occurred in respective pixels of the image pickup apparatus.

Hereinafter, an exemplary embodiment of the present invention will be described in detail below with reference to the attached drawings. FIG. 1 is an equivalent circuit diagram illustrating a schematic circuit of a pixel P of the image pickup apparatus according to the present exemplary embodiment. The pixel P can include a conversion unit CP, an amplification unit AP, a reset unit RP, a first holding unit SH1, a second holding unit SH2, a third holding unit SH3, a first output unit OP1, a second output unit OP2, and a third output unit OP3.

The conversion unit CP can include a photodiode PD, a transistor M1, a floating diffusion capacitance $C_{FD}$ (hereinafter, referred to as "FD capacitance $C_{FD}$"), and an additional capacitance $C_{FD}'$ dedicated to sensitivity switching. The photodiode PD is a photoelectric conversion element. When a scintillator (i.e., a wavelength conversion member) generates light according to emission of radiation, the photodiode PD converts the light into an electric signal. More specifically, a wavelength conversion member capable of converting radiation into light and a photoelectric conversion element capable of converting light into electric charge can be used as conversion elements included in the conversion unit. However, an element capable of directly converting radiation into electric charge is usable as a conversion element. More specifically, the photodiode PD generates electric charge according to the light. The FD capacitance $C_{FD}$ outputs a voltage corresponding to the generated electric charge amount into the amplification unit AP. Further, the sensitivity switching capacitance $C_{FD}'$ is capable of switching the radiation sensitivity of the pixel P and is connected to the photodiode PD via the transistor M1 (i.e., a switching element). In response to activation of a signal WIDE, the transistor M1 is brought into conductive state. A voltage corresponding to a composite capacitance of the FD capacitance $C_{FD}$ and the capacitance $C_{FD}'$ is output to the amplification unit AP. More specifically, by controlling the conductive state of the transistor M1, the first signal (i.e., the voltage corresponding to the electric charge converted by the conversion unit CP having the first sensitivity) or the second signal (i.e., the voltage corresponding to the electric charge converted by the conversion unit CP having the second sensitivity, which is different from the first sensitivity) can be selectively output to the amplification unit AP.

The amplification unit AP includes a first control transistor M3, a first amplifying transistor M4, a clamp capacitor $C_{CL}$, a second control transistor M6, a second amplifying transistor M7, and respective constant current sources. The first control transistor M3, the first amplifying transistor M4, and an associated constant current source (e.g., a transistor having a current mirror configuration) are serially connected in such a way as to form a current path. In response to activation of an enable signal EN input to the gate of the first control transistor M3, the first amplifying transistor M4 is brought into an operational state to receive the voltage from the conversion unit CP. In this manner, a source follower circuit can be formed. A voltage obtainable by amplifying the voltage output from the conversion unit CP can be output from the first amplifying transistor M4. The voltage output from the first amplifying transistor M4 is input to the second amplifying transistor M7 via the clamp capacitor $C_{CL}$. The second control transistor M6, the second amplifying transistor M7, and the associated constant current source are serially connected in such a way as to form a current path. In response to activation of an enable signal EN input to the gate of the second control transistor M6, the first amplifying transistor M4 is brought into an operational state to receive the voltage from the first amplifying transistor M4. In this manner, a source follower circuit can be formed. A voltage obtainable by amplifying the voltage from the first amplifying transistor M4 can be output from the second amplifying transistor M7. The clamp capacitor $C_{CL}$ is serially disposed between the first amplifying transistor M4 and the second amplifying transistor M7. A clamp operation that can be performed using the clamp capacitor $C_{CL}$ will be described in detail below together with the reset unit RP.

The reset unit RP includes a first reset transistor M2 and a second reset transistor M5. In response to activation of a PRES signal, the first reset transistor M2 supplies a predetermined potential to the photodiode PD and initializes the electric charge of the photodiode PD, and further resets the voltage to be output to the amplification unit AP. The second reset transistor M5 supplies a predetermined potential to a connection node between the clamp capacitor $C_{CL}$ and the second amplifying transistor M7 to reset the voltage to be output from the second amplifying transistor M7. A voltage corresponding to the voltage output from the conversion unit CP during the reset operation by the first reset transistor M2 is input to a terminal n1 of the clamp capacitor $C_{CL}$. Further, in response to activation of a clamp signal PCL, the second reset transistor M5 is brought into conductive state. A clamp voltage VCL (i.e., a predetermined potential) is input to a terminal n2 of the clamp capacitor $C_{CL}$. In this manner, the reset unit RP clamps a potential difference between both terminals n1 and n2 of the clamp capacitor $C_{CL}$ as a noise component and outputs a change amount of voltage caused by subsequent generation and storage of the electric charge by the photodiode PD as a signal component. Via the above-mentioned clamp operation using the clamp capacitor $C_{CL}$, noise components, such as a kTC noise occurring in the conversion unit CP and offset of the first amplifying transistor M4 are suppressed.

The first holding unit SH1 is capable of holding the first signal obtainable when the electric charge converted by the conversion unit CP having the first sensitivity is amplified by the amplification unit AP. The first holding unit SH1 is a sample and hold circuit that includes a first transfer transistor M8 and a first holding capacitor CS1. More specifically, the first holding unit SH1 performs a sampling operation for transferring the first signal (i.e., the signal obtainable when the electric charge converted by the conversion unit CP having the first sensitivity is amplified by the amplification unit AP) to the capacitance CS1 and holding the transferred signal, by switching the operational state (i.e., conductive state or non-conductive state) of the first transfer transistor M8 with reference to a control signal TS1. The first output unit OP1 includes a first signal amplifying transistor M10 and a first output switch SW9. The first signal amplifying transistor M10 is a transistor that can output a signal obtainable by amplifying the voltage held by the first holding capacitor CS1. The first output switch SW9 is a switch capable of transferring the signal output from the first signal amplifying transistor M10. More specifically, when the first output switch SW9 is brought into conductive state in response to a control signal VSR input to the first output switch SW9, a source follower circuit can be formed by a post-stage constant current source (not illustrated) and the first signal amplifying transistor M10. Accordingly, the first output unit OP1 can output the first output signal from the pixel P based on the first signal or the voltage held by the first holding capacitor CS1.

The second holding unit SH2 is capable of holding the second signal obtainable when the electric charge converted by the conversion unit CP having the second sensitivity, which is different from first sensitivity, is amplified by the amplification unit AP. The second holding unit SH2 is a sample and hold circuit that includes a second transfer transistor M11 and a second holding capacitor CS2. More specifically, the second holding unit SH2 performs a sampling operation for transferring the second signal (i.e., the signal obtainable when the electric charge converted by the conversion unit CP having the second sensitivity is amplified by the amplification unit AP) to the capacitance CS2 and holding the transferred signal, by switching the operational state (i.e., conductive state or non-conductive state) of the second transfer transistor M11 with reference to a control signal TS2. The second output unit OP2 includes a second signal amplifying transistor M13 and a second output switch SW12. The second signal amplifying transistor M13 is a transistor that can output a signal obtainable by amplifying the voltage held by the second holding capacitor CS2. The second output switch SW12 is a switch capable of transferring the signal output from the second signal amplifying transistor M13. More specifically, when the second output switch SW12 is brought into conductive state in response to a control signal VSR input to the second output switch SW12, a source follower circuit can be formed by a post-stage constant current source (not illustrated) and the second signal amplifying transistor M13. Accordingly, the second output unit OP2 can output the second output signal from the pixel P based on the second signal or the voltage held by the second holding capacitor CS2.

The third holding unit SH3 is capable of holding an offset signal of the amplification unit AP and is a sample and hold circuit that includes a third transfer transistor M14 and a second holding capacitor CN. More specifically, the third holding unit SH3 performs a sampling operation for transferring the offset signal of the amplification unit AP to the capacitance CN and holding the transferred signal, by switching the operational state (i.e., conductive state or non-conductive state) of the third transfer transistor M14 with reference to a control signal TS3. The third output unit OP3 includes a third signal amplifying transistor M16 and a third output switch SW15. The third signal amplifying transistor M16 is a transistor that can output a signal obtainable by amplifying the voltage held by the third holding capacitor CN. The third output switch SW15 is a switch capable of transferring the signal output from the third signal amplifying transistor M16. More specifically, when the third output switch SW15 is brought into conductive state in response to a control signal VSR input to the third output switch SW15, a source follower circuit can be formed by a post-stage constant current source (not illustrated) and the third signal amplifying transistor M16. Accordingly, the third output unit OP3 can output the third output signal from the pixel P based on the offset signal.

A pixel array 120 includes a plurality of pixels, each having the above-mentioned configuration, which is arranged in a two-dimensional pattern. A signal reading unit 20 can read a signal output from the pixel array 120. Hereinafter, the pixel array 120 and the signal reading unit 20 of the image pickup apparatus according to the present exemplary embodiment will be described in detail below with reference to FIGS. 2A and 2B.

Figure 2A:
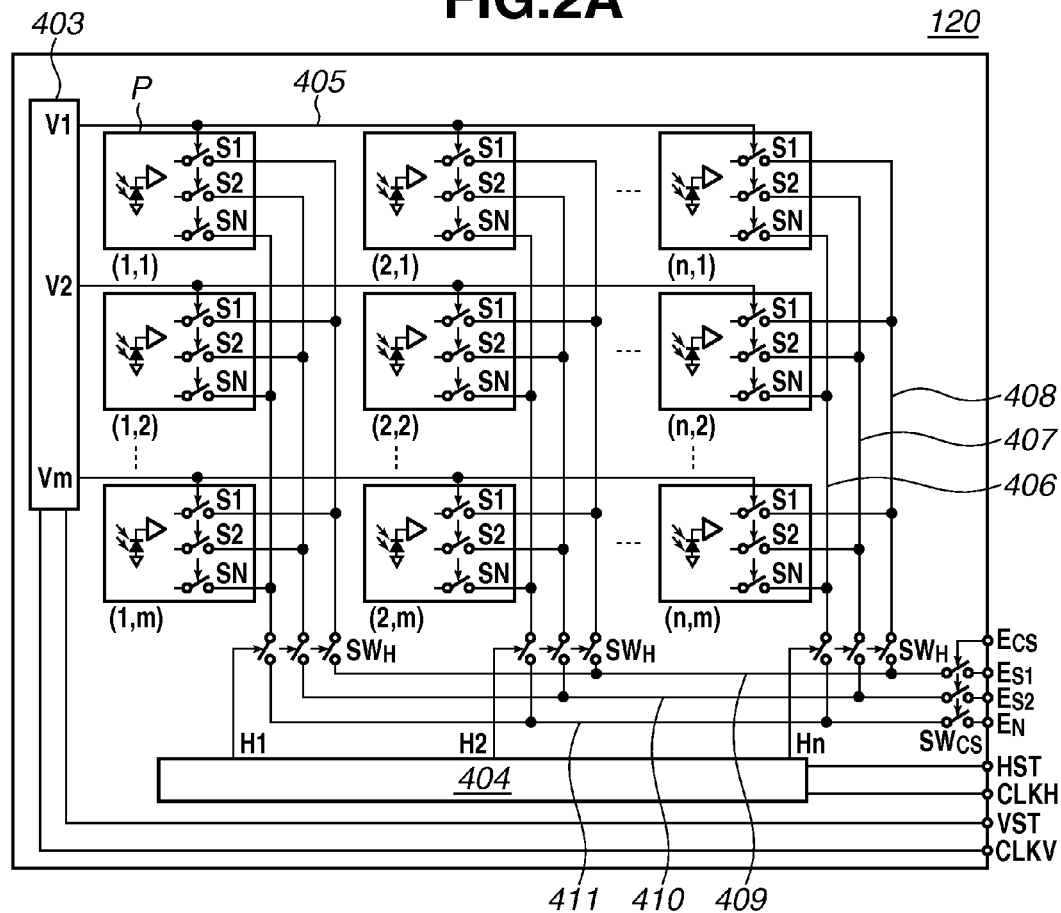
FIGS. 2A and 2B are equivalent circuit diagrams illustrating a pixel array and a signal reading unit of an image pickup apparatus according to an exemplary embodiment.

First, the pixel array 120 of the image pickup apparatus according to the present exemplary embodiment will be described in detail below with reference to FIG. 2A. FIG. 2A is an equivalent circuit diagram illustrating a schematic configuration of the pixel array 120 provided in the image pickup apparatus according to the present exemplary embodiment.

The pixel array 120 includes a plurality of pixels P, a vertical scanning circuit 403 that can drive each pixel P, and a horizontal scanning circuit 404 that can read a signal from each pixel P. Each of the vertical scanning circuit 403 and the horizontal scanning circuit 404 is constituted, for example, by a shift register and is operable based on the control signal from a control unit 109. The vertical scanning circuit 403 can input the control signal VSR to each pixel P via a control line 405 to drive each pixel P based on the control signal VSR for each row thereof. More specifically, the vertical scanning circuit 403 is functionally operable as a row selection unit configured to select a pixel P to be subjected to a signal reading operation for each row. Further, the horizontal scanning circuit 404 is functionally operable as a column selection unit configured to select a pixel P based on a control signal HSR for each column and perform a horizontal transfer operation to output signals sequentially from the selected pixels P. An operating frequency of the row selection unit (i.e., the vertical scanning circuit 403) is greater than that of the column selection unit (i.e., the horizontal scanning circuit 404). In other words, the row selection unit (i.e., the vertical scanning circuit 403) is slow in operating speed compared to the column selection unit (i.e., the horizontal scanning circuit 404).

Further, the pixel array 120 includes a terminal $E_{S1}$ to read the first signal from the capacitance CS1 of each pixel P, a terminal $E_{S2}$ to read the second signal from the capacitance CS2, and a terminal $E_N$ to read the voltage from the capacitance CN. The pixel array 120 further includes a selection terminal $E_{CS}$. In response to activation of a signal supplied to the terminal $E_{CS}$, signals of respective pixels P constituting the pixel array 120 can be read out via the terminals $E_{S1}$, $E_{S2}$, and $E_N$.

More specifically, terminals S1, S2, and SN of the above-mentioned each pixel P are connected to column signal lines 406 to 408 corresponding to respective terminals. The column signal lines 406 to 408 are connected to analog output lines 409 to 411 via a switch $SW_H$ that can be brought into conductive state in response to a control signal supplied from the horizontal scanning circuit 404. Signals of respective analog output lines 409 to 411 can be output from respective terminal $E_{S1}$, $E_{S2}$ and $E_N$ via a switch $SW_{CS}$ that is brought into conductive state in response to a signal supplied to the terminal $E_{CS}$.

Further, the pixel array 120 further includes terminals HST, CLKH, VST and CLKV to receive control signals for controlling the vertical scanning circuit 403 and the horizontal scanning circuit 404. The terminal HST receives a start pulse input to the horizontal scanning circuit 404. The terminal CLKH receives a clock signal input to the horizontal scanning circuit 404. The terminal VST receives a start pulse input to the vertical scanning circuit 403. The terminal CLKV receives a clock signal input to the vertical scanning circuit 403. These control signals can be input from the control unit 109. The horizontal scanning circuit 404 generates and outputs the control signal HSR based on the start pulse and the clock signal input via the terminals HST and CLKH. The vertical scanning circuit 403 generates and outputs the control signal VSR based on the start pulse and the clock signal input via the terminals VST and CLKV. Accordingly, the first signal or the first output signal, the second output signal, and the third output signal can be sequentially read out from each pixel according to an X-Y address method. More specifically, the pixel array 120 performs the signal reading operation in such a way as to control each row of pixels P and output (horizontally transfer) the signals held by respective holding units of the same column.

Figure 2B:
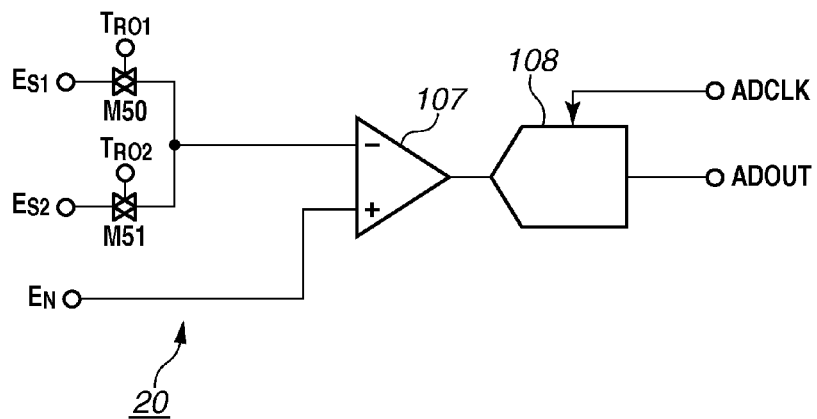

Next, the signal reading unit 20 of the image pickup apparatus according to the present exemplary embodiment will be described in detail below with reference to FIG. 2B. FIG. 2B is an equivalent circuit diagram illustrating a schematic configuration of the signal reading unit 20 of the image pickup apparatus according to the present exemplary embodiment.

The signal reading unit 20 can include a signal amplification unit 107 including, for example, a differential amplifier and an AD conversion unit 108 configured to perform AD conversion processing. The signal from the terminal $E_{S1}$ can be input to an inversion input terminal of the signal amplification unit 107 via a switch M50 that can be brought into conductive state in response to a control signal supplied from a terminal $T_{RO1}$. Further, the signal from the terminal $E_{S2}$ can be input to the inversion input terminal of the signal amplification unit 107 via a switch M51 that can be brought into conductive state in response to a control signal supplied from a terminal $T_{RO2}$. Two switches M50 and M51 are controlled in such a way as to input one of the signals received from the terminal $E_{S1}$ and the terminal $E_{S2}$ to the inversion input terminal of the signal amplification unit 107. Each of the switches M50 and M51 and the signal amplification unit 107 may be designed to have response characteristics sufficient to follow up the cycle of a signal ADCLK.

Further, the signal from the terminal $E_N$ can be input to a non-inversion input terminal of the signal amplification unit 107. The signal amplification unit 107 can amplify a difference between the signal received via the terminal $E_{S1}$ and the signal received via the terminal $E_N$, or a difference between the signal received via the terminal $E_{S2}$ and the signal received via the terminal $E_N$. The above-mentioned difference can be AD converted by the AD conversion unit 108 based on a clock signal input via an ADCLK terminal. The above-mentioned configuration is used to remove the above-mentioned fixed pattern noise and obtain image data (digital data) from the pixel array 120. The obtained image data (digital data) can be output to the control unit 109 via an ADOUT terminal.

Figure 3:
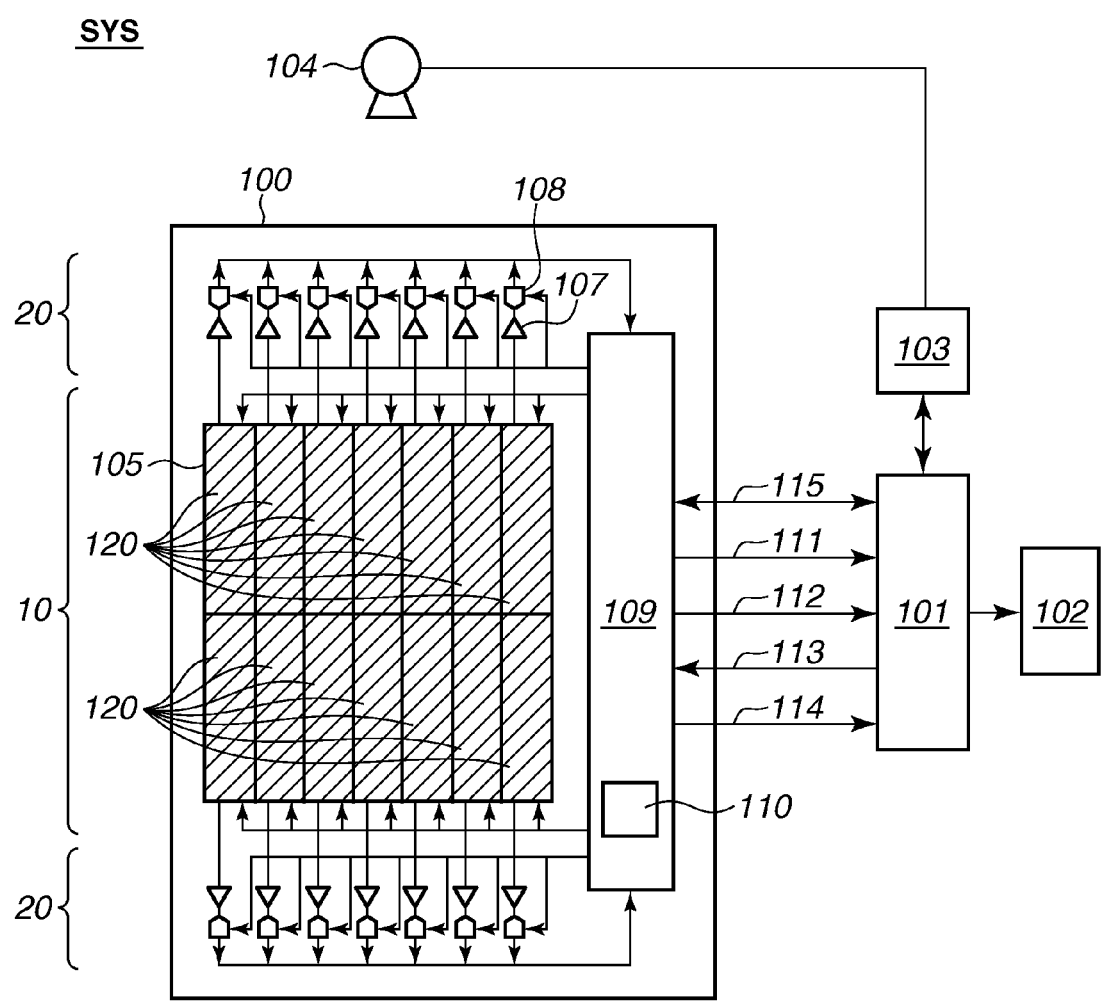
FIG. 3 is a schematic view illustrating an image pickup apparatus and a radiation image pickup system according to an exemplary embodiment.

The image pickup apparatus 100 and the radiation image pickup system SYS according to the present exemplary embodiment are configured to include the pixel array 120 and the signal reading unit 20 having the above-mentioned configuration. Next, the image pickup apparatus 100 and the radiation image pickup system SYS according to the present exemplary embodiment will be described in detail below with reference to FIG. 3. FIG. 3 is a schematic view illustrating a schematic configuration of the image pickup apparatus 100 and the radiation image pickup system SYS according to the present exemplary embodiment.

The radiation image pickup system SYS includes the radiation image pickup apparatus 100 (hereinafter, referred to as "image pickup apparatus 100"), a radiation generating apparatus 104 that can generate radioactive rays, an irradiation control unit 103, a processing unit 101 configured to perform image processing and system control operations, and a display unit 102 including a display device. When the radiation image pickup system SYS performs a radiographic imaging operation, the processing unit 101 synchronously controls the image pickup apparatus 100 and the irradiation control unit 103. The image pickup apparatus 100 can detect a radioactive ray (e.g., X-ray, α-ray, β-ray, or γ-ray) having passed through an examinee's body. The processing unit 101 can perform predetermined processing on the detected radioactive ray to generate image data based on the detected radioactive ray. The display unit 102 can display the generated image data as a radiographic image. The image pickup apparatus 100 includes an imaging panel 105 having an image pickup region 10, the signal reading unit 20 that can read signals from the image pickup region 10, and the control unit 109 that can control each unit.

The imaging panel 105 is constituted by a plurality of pixel arrays 120 tiled (i.e., two-dimensionally arranged) on a flat base so that a large-scale imaging panel can be formed. Each pixel array 120 includes a plurality of pixels P arranged in a predetermined pattern. The image pickup region 10 includes numerous pixels P of a plurality of pixel arrays 120 arranged in such a way as to form a plurality of rows and columns. The image pickup region 10 illustrated in FIG. 3 includes pixel arrays 120 that are tiled to form a matrix pattern of 7 columns×2 rows, although the configuration of the image pickup region 10 is not limited to the illustrated configuration.

For example, in a case where it is necessary to convert radiation into electric charge, the image pickup region 10 can include the scintillator (not illustrated) provided thereon, which serves as the wavelength conversion member capable of converting radiation into light. Each pixel P can be a conventionally known pixel capable of performing photoelectric conversion. Accordingly, an electric signal representing the amount of emitted radiation can be obtained.

For example, the control unit 109 can communicate with the processing unit 101 to transmit and receive control commands and synchronization signal and can output image data to the processing unit 101. Further, the control unit 109 can control the image pickup region 10 and each unit. For example, the control unit 109 can perform a driving control and an operational mode control for each pixel. Further, the control unit 109 can generate a composite frame data based on the image data (digital data) of each pixel array 120 obtainable through the AD conversion by the AD conversion unit 108 of the signal reading unit 20. The control unit 109 can output the composite frame data to the processing unit 101. More specifically, the control unit 109 can include a correction unit 110 according to the present exemplary embodiment. The correction unit 110 will be described in detail below.

Various interfaces are provided between the control unit 109 and the processing unit 101 to transmit and receive control commands, control signals, and image data. The processing unit 101 can output setting information (e.g., operational mode and various parameters) and imaging information to the control unit 109 via a control interface 115. Further, the control unit 109 can output apparatus information (e.g., operational state of the image pickup apparatus 100) to the processing unit 101 via the control interface 115. Further, the control unit 109 can output the image data obtained by the image pickup apparatus 100 to the processing unit 101 via an image data interface 111. Further, the control unit 109 can output a READY signal 112 to the processing unit 101 to notify a state of the image pickup apparatus 100 that is ready to perform an imaging operation. Further, the processing unit 101 can output an external synchronization signal 113 to the control unit 109 to notify a radiation exposure start (irradiation) timing in response to the READY signal 112 output from the control unit 109. Further, the control unit 109 can output an irradiation permission signal 114 to the processing unit 101. While the irradiation permission signal 114 is in an enable state, the processing unit 101 can output a control signal to cause the irradiation control unit 103 to start the radiation exposure.

Figure 5A:
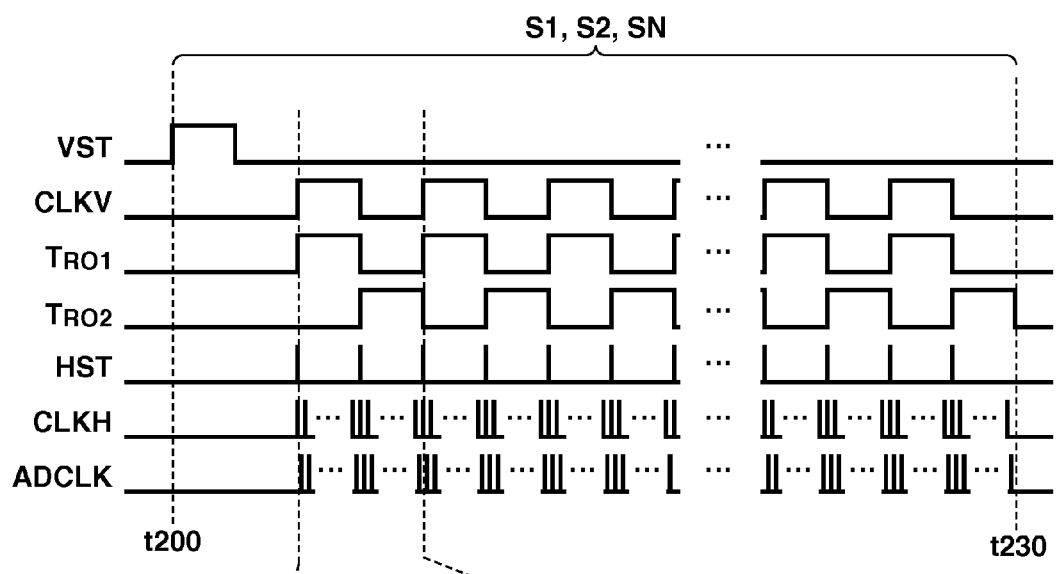
FIGS. 5A and 5B are timing charts illustrating an operational mode of an image pickup apparatus according to an exemplary embodiment that performs dynamic range expansion.
Figure 5B:
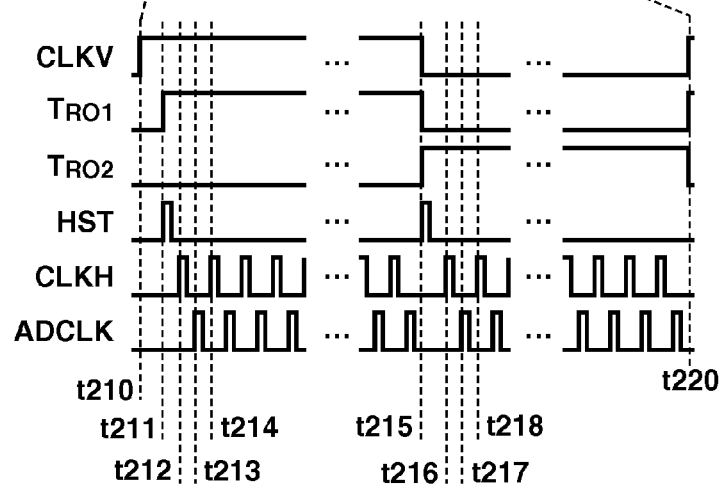

The image pickup apparatus 100 having the above-mentioned configuration can have an operational mode capable of acquiring two signals at mutually different sensitivity levels from each pixel and generating image data with reference to the acquired signals (e.g., an operational mode for performing dynamic range expansion). As a method for attaining the above-mentioned operational mode, it is possible to cause the first holding unit SH1 and the second holding unit SH2 of each pixel P to hold and read out the first signal obtained at the first sensitivity and the second signal obtained at the second sensitivity, respectively, and generate a composite signal based on the readout signals of respective sensitivity levels for each pixel. The operational mode for performing the dynamic range expansion that can be realized by the image pickup apparatus according to the present exemplary embodiment will be described in detail below with reference to FIGS. 4A to 4C and FIGS. 5A and 5B. FIG. 4A is a schematic timing chart illustrating an entire sequence of the operational mode according to which the image pickup apparatus according to the present exemplary embodiment performs the dynamic range expansion. FIG. 4B is a schematic timing chart illustrating reset drive operation RD illustrated in FIG. 4A. FIG. 4C is a schematic timing chart illustrating sampling drive operation SD illustrated in FIG. 4A. FIG. 5A is a schematic timing chart illustrating a selection operation in reading drive operations READ S1 to READ SN illustrated in FIG. 4A. FIG. 5B is a schematic timing chart illustrating an enlarged part of the timing chart illustrated in FIG. 5A. In FIGS. 4A to 4C and FIGS. 5A and 5B, signals similar to those already described are denoted by the same reference characters and detailed description thereof will be omitted.

First, at time t1 illustrated in FIG. 4A, the image pickup apparatus 100 performs operational mode setting and imaging start setting. Subsequently, at time t2, the image pickup apparatus 100 starts an imaging drive operation. Subsequently, the image pickup apparatus 100 alternately repeats the reset drive operation RD illustrated in the enlarged view of FIG. 4B and the sampling drive operation SD illustrated in the enlarged view of FIG. 4C. Further, after completing the sampling drive operation SD (and before starting the next reset drive operation RD), the image pickup apparatus 100 performs reading drive operations READ S1 to READ SN to read signals from the image pickup region 10.

The reset drive operation RD includes a reset operation and a clamp operation. More specifically, as illustrated in FIG. 4B, at time t2, the image pickup apparatus 100 sets the enable signal EN to High level in such a way as to bring the first control transistor M3 and the second control transistor M6 into conductive state. Accordingly, the first amplifying transistor M4 and the second amplifying transistor M7 can cooperatively perform a source-follower operation. Further, at time t2, the image pickup apparatus 100 sets the signal PRES to High level in such a way as to bring the first reset transistor M2 into conductive state. Accordingly, the photodiode PD is connected to a reference voltage VRES and the photodiode PD can be reset. Further, a voltage corresponding to the gate voltage of the transistor M4 obtainable immediately after completing the reset operation can be input to one terminal n1 (i.e., the terminal adjacent to the transistor M4) of the clamp capacitor $C_{CL}$. At time t3, the image pickup apparatus 100 sets the signal PCL to High level in such a way as to bring the second reset transistor M5 into conductive state. Accordingly, the clamp voltage VCL can be input to the other terminal n2 of the clamp capacitor $C_{CL}$, (i.e., the terminal adjacent to the transistor M7). At time t4, the image pickup apparatus 100 sets the signals TS1, TS2, and TN to High level in such a way as to bring the first transfer transistor M8, the second transfer transistor M11, and the third transfer transistor M14 into conductive state. Accordingly, the capacitances CS1, CS2, and CN are brought into initial state (corresponding to the output voltage of the amplification unit AP when the gate voltage of the second amplifying transistor M7 is the reference voltage VCL). Further, at time t4, the image pickup apparatus 100 sets the signal WIDE to High level in such a way as to bring the sensitivity switching transistor M1 into conductive state. Accordingly, the capacitance $C_{FD}'$ is connected to the reference voltage VRES and the voltage of the capacitance $C_{FD}'$ can be reset. At time t5, the image pickup apparatus 100 sets the signals TS1, TS2, and TN to Low level in such a way as to bring the first transfer transistor M8, the second transfer transistor M11, and the third transfer transistor M14 into non-conductive state. Accordingly, the voltages of the capacitances CS1, CS2, and CN can be fixed. Further, at time t5, the image pickup apparatus 100 sets the signal WIDE to Low level in such a way as to bring the sensitivity switching transistor M1 into non-conductive state. Accordingly, the capacitance $C_{FD}'$ can be fixed to the reference voltage VRES. Next, at time t6, the image pickup apparatus 100 sets the signal PRES to Low level in such a way as to bring the first reset transistor M2 into non-conductive state. Accordingly, the terminal n1 of the clamp capacitor $C_{CL}$ can be set to a voltage corresponding to the gate voltage of the first amplifying transistor M4 obtainable immediately after completing the reset operation. At time t7, the image pickup apparatus 100 sets the signal PCL to Low level in such a way as to bring the second reset transistor M5 into non-conductive state. Accordingly, an electric charge corresponding to a potential difference between the terminal n1 and the terminal n2 can be held by the clamp capacitor $C_{CL}$. Noise components, such as the kTC noise of the conversion unit CP and the offset of the first amplifying transistor M4, can be held by the clamp capacitor $C_{CL}$. Through the above-mentioned processing, the image pickup apparatus 100 completes the reset operation and the clamp operation. Next, at time t8, the image pickup apparatus 100 sets the enable signal EN to Low level in such a way as to bring the first control transistor M3 and the second control transistor M6 into non-conductive state. Accordingly, the first amplifying transistor M4 and the second amplifying transistor M7 are brought into non-operational state. As mentioned above, the image pickup apparatus 100 terminates sequential processing of the reset drive operation RD. More specifically, the reset drive operation RD includes resetting the photodiode PD, holding the noise components (e.g., the kTC noise of the conversion unit CP and the noise derived from the offset of the first amplifying transistor) in the clamp capacitor $C_{CL}$, and initializing the capacitances CS1, CS2, and CN. The image pickup apparatus 100 performs the above-mentioned reset drive operation RD for all pixels P simultaneously. More specifically, the above-mentioned control signals EN, PRES, PCL, TS1, TS2, TN, and WIDE are supplied to all pixels P simultaneously at the same timing.

The sampling drive operation SD according to the operational mode for expanding the dynamic range includes driving each pixel P at two sensitivity levels and holding the signals obtained at respective sensitivity levels in the capacitances CS1 and CS2, respectively. More specifically, at time t11 illustrated in FIG. 5C, the image pickup apparatus 100 sets the enable signal EN to High level in such a way as to bring the first control transistor M3 and the second control transistor M6 into conductive state. Accordingly, the first amplifying transistor M4 and the second amplifying transistor M7 can cooperatively perform a source-follower operation. As the signal WIDE is maintained at Low level at time t11, the pixel P operates in a high sensitivity mode that corresponds to the first sensitivity. The gate voltage of the first amplifying transistor M4 (more specifically, the voltage of the FD capacitance $C_{FD}$) is variable depending on the amount of electric charge generated and stored in the photodiode PD. A voltage corresponding to the changed gate voltage is input to the terminal n1 of the clamp capacitor $C_{CL}$, and the potential of the terminal n1 changes. The potential change of the other terminal n2 of the clamp capacitor $C_{CL}$, is dependent on the potential change of the terminal n1. As mentioned above, the clamp capacitor $C_{CL}$, holds a voltage corresponding to the kTC noise. Therefore, the second amplifying transistor M7 outputs the potential change amount as a signal component. At time t12, the image pickup apparatus 100 sets the signal TS1 to High level in such a way as to bring the first transfer transistor M8 into conductive state. In other words, the image pickup apparatus 100 starts sampling (or transferring) the output of the amplification unit AP in the above-mentioned high sensitivity mode. More specifically, a voltage output from the amplification unit AP (i.e., a voltage corresponding to the gate voltage of the second amplifying transistor M7) according to the driving at time t11 is transferred to the first holding capacitor CS1. Next, at time t13, namely after starting the sampling at time t12, the image pickup apparatus 100 sets the irradiation permission signal (not illustrated) to Low level (i.e., a prohibited state). Subsequently, at time t14, the image pickup apparatus 100 sets the signal TS1 to Low level in such a way as to bring the first transfer transistor M8 into non-conductive state. In short, the image pickup apparatus 100 terminates the operation for transferring the voltage output from the amplification unit AP and holds the output voltage in the first holding capacitor CS1. More specifically, the voltage of the first holding capacitor CS1 is fixed to the voltage output from the amplification unit AP. More specifically, at times t12 to t14, the first signal deriving from the electric charge of the conversion unit CP having the first sensitivity is held in the first holding capacitor CS1 of the first holding unit SH1. At time t15, the image pickup apparatus 100 sets the signal WIDE to High level in such a way as to bring the sensitivity switching transistor M1 into conductive state. Accordingly, the capacitance $C_{FD}'$ is electrically connected to the photodiode PD via the transistor M1. The gate voltage of the transistor M4 becomes a value corresponding to a composite capacitance obtainable from the FD capacitance $C_{FD}$ and the capacitance $C_{FD}'$. The composite capacitance is greater than the FD capacitance $C_{FD}$. Therefore, the gate voltage of the first amplifying transistor M4 does not change so greatly. More specifically, the operational mode of the pixel P is switched into a low sensitivity mode corresponding to the second sensitivity. On the other hand, it becomes possible to read the electric charge of the photodiode PD. At time t16, the image pickup apparatus 100 sets the signal TS2 to High level in such a way as to bring the second transfer transistor M11 into conductive state. More specifically, the image pickup apparatus 100 starts sampling (or transferring) the output of the amplification unit AP in the above-mentioned low sensitivity mode. More specifically, the second holding capacitor CS2 becomes the voltage output from the amplification unit AP according to the driving at time t15. Subsequently, at time t17, the image pickup apparatus 100 sets the signal TS2 to Low level in such a way as to bring the second transfer transistor M11 into non-conductive state. In short, the image pickup apparatus 100 terminates the operation for transferring the voltage output from the amplification unit AP and holds the output voltage in the second holding capacitor CS2. More specifically, the voltage of the second holding capacitor CS2 is fixed to the voltage output from the amplification unit AP. More specifically, at times t16 and t17, the second signal deriving from the electric charge of the conversion unit CP having the second sensitivity is held in the second holding capacitor CS2 of the second holding unit SH2. Next, at time t18, the image pickup apparatus 100 sets the signal PRES to High level in such a way as to bring the first reset transistor M2 into conductive state. Accordingly, the voltages of the FD capacitance $C_{FD}$ and the capacitance $C_{FD}'$ can be reset to the reference voltage VRES. Further, the voltage of the terminal n1 can be reset to the state of time t3. At time t19, the image pickup apparatus 100 sets the signal PCL to High level in such a way as to bring the second reset transistor M5 into conductive state. The clamp voltage VCL is input to the other terminal n2 of the clamp capacitor $C_{CL}$, (i.e., the terminal adjacent to the transistor M7). At time t20, the image pickup apparatus 100 sets the signals PRES and WIDE to Low level in such a way as to bring the transistor M1 and the first reset transistor M2 into non-conductive state. Accordingly, the capacitance $C_{FD}'$ is fixed to the voltage obtainable immediately after completing the reset operation. Further, the terminal n1 of the clamp capacitor $C_{CL}$, can be set to a voltage corresponding to the gate voltage of the first amplifying transistor M4 obtainable immediately after completing the reset operation. At time t21, the image pickup apparatus 100 sets the signal TN to High level in such a way as to bring the third transfer transistor M14 into conductive state. Accordingly, the voltage output from the amplification unit AP when the gate voltage of the second amplifying transistor M7 is the reference voltage VCL can be transferred. The voltage obtained in this case is the voltage of the third holding capacitor CN. At time t22, the image pickup apparatus 100 sets the signal TN to Low level in such a way as to bring the third transfer transistor M14 into non-conductive state. Accordingly, the voltage of the third holding capacitor CN can be fixed. More specifically, at times t21 to t22, the offset signal can be held in the third holding capacitor CN. The offset signal is based on a voltage corresponding to the noise component derived from the offset of the second amplifying transistor M7, such as thermal noise dependent on the circuit configuration of the amplification unit AP, 1/f noise, temperature difference, and process variations. Then, at time t23, the image pickup apparatus 100 sets the signal PCL to Low level in such a way as to bring the second reset transistor M5 into non-conductive state. At time t24, the image pickup apparatus 100 sets the enable signal EN to Low level in such a way as to bring the first control transistor M3 and the second control transistor M6 into non-conductive state. Then, the image pickup apparatus 100 terminates sequential processing of the sampling drive operation SD. More specifically, in the sampling drive operation SD, the first signal obtainable by the pixel P having the first sensitivity can be held in the first holding capacitor CS1, the second signal obtainable by the pixel P having the second sensitivity can be held in the second holding capacitor CS2, and the offset signal of the amplification unit AP can be held in the third holding capacitor CN, respectively. Similar to the above-mentioned reset drive operation RD, the image pickup apparatus 100 performs the sampling drive operation SD for all pixels P simultaneously to eliminate any variations in the control timing of the pixel array 120. More specifically, the above-mentioned control signals EN, PRES, PCL, TS1, TS2, TN, and WIDE are supplied to all pixels simultaneously at the same timing.

As mentioned above, in reading each signal held by each holding unit of each pixel P, the image pickup apparatus 100 reads out image signals from all pixels P by selecting a plurality of pixels P belonging to each row, sequentially selecting a plurality of pixels P belonging to the selected row for each column, and repeating the above-mentioned operations for each row. To this end, the image pickup apparatus 100 performs the reading drive operations READ S1 to READ SN illustrated in FIG. 4A, which will be further described in detail below with reference to FIGS. 5A and 5B. FIGS. 5A and 5B are timing charts illustrating an operation for reading out the control signals input to respective control terminals (e.g., VST, CLKV, $T_{RO1}$, $T_{RO2}$, HST, CLKH, and ADCLK) illustrated in FIGS. 2A and 2B.

According to the example illustrated in FIGS. 5A and 5B, the image pickup apparatus 100 reads signals from respective pixels P belonging to the first row during a period of time t210 to time t220. The image pickup apparatus 100 reads the first signal from each pixel P in the former part and reads the second signal from each pixel P in the latter part. When the image pickup apparatus 100 reads signals from the pixel array 120, a High level signal is input to the terminal $E_{CS}$ of the pixel array 120 and therefore the switch $SW_{CS}$ is kept in conductive state.

More specifically, the image pickup apparatus 100 performs the signal reading operation according to the following sequence. First, after receiving the start pulse via the terminal VST at time t200, the vertical scanning circuit 403 receives the clock signal CLKV at time t210 and outputs the control signal VSR to respective output units OP1 to OP3 of the pixels P belonging to the first row via the first row control line 405. Accordingly, respective output switches SW9, SW12, and SW15 of the pixels P belonging to the first row are brought into conductive state. Each pixel P belonging to the first row can be selected. Subsequently, during a period of time t211 to time t215, the image pickup apparatus 100 sets the signal $T_{RO1}$ to High level and sets the signal $T_{RO2}$ to Low level. Accordingly, in this state, the first signal can be output from each pixel P. Then, after receiving the start pulse via the terminal HST at time t211, the horizontal scanning circuit 404 receives the clock signal CLKH at time t212. In response to the reception of the clock signal CLKH, the horizontal scanning circuit 404 sequentially shifts the selected column from the first column to the n-th column. The signal ADCLK is input between two clock signals CLKH (e.g., at time t213). Then, based on the input signal ADCLK, the signal reading unit 20 performs AD conversion on the first signal from the pixel P of the selected column. Subsequently, for example, at time t214, the horizontal scanning circuit 404 selects a pixel P belonging to the next column. The signal reading unit 20 similarly performs AD conversion on the first signal of the selected pixel P. As mentioned above, the image pickup apparatus 100 performs the first signal reading operation sequentially for each column from the first column to the n-th column. Subsequently, at time t215, the image pickup apparatus 100 sets the signal $T_{RO1}$ to Low level and sets the signal $T_{RO2}$ to High level and performs the second signal reading operation sequentially for each column from the first column to the n-th column according to the similar procedure. The digital data output to the control unit 109 can be transmitted to the processing unit 101 via the image data interface 111, for each row of the imaging panel 105, according to the reading order of the signal reading unit 20. The processing unit 101 can output one-frame image signals corresponding to the first and second signals. Through the above-mentioned operations, the image pickup apparatus 100 reads out both the image signal deriving from the signal acquired at the first sensitivity and the image signal deriving from the signal acquired at the second sensitivity. Further, the image pickup apparatus 100 can read out a one-frame offset image signal based on the offset signal. Then, the image pickup apparatus 100 obtains a composite image signal whose dynamic range has been expanded by combining the image signal deriving from the signal acquired at the first sensitivity and the image signal deriving from the signal acquired at the second sensitivity in association with each pixel P. Then, the image pickup apparatus 100 performs noise reduction processing based on the offset image signal in association with each pixel P. The image pickup apparatus 100 can independently perform the noise reduction processing on each of the image signals before they are combined. Alternatively, the image pickup apparatus 100 can perform the noise reduction processing on the composite image signal.

On the other hand, in the configuration of the above-mentioned exemplary embodiment, if the operational mode is changed to any other mode that does not perform the dynamic range expansion, it is desired that the image pickup apparatus 100 performs correction in such a way as to reflect temperature dependency of the noise components as described below.

Figure 6C:
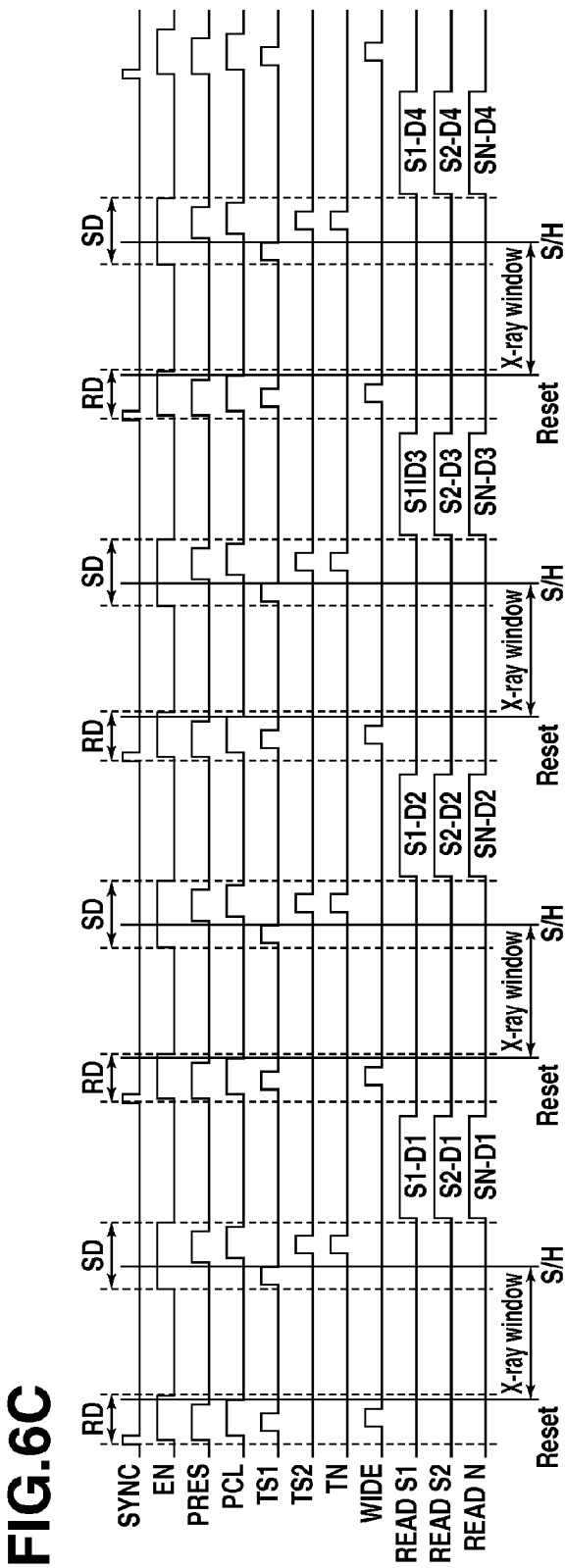

First, examples of the processing that can be realized by the image pickup apparatus according to a first exemplary embodiment will be described in detail below with reference to timing charts illustrated in FIGS. 6A to 6C. The example illustrated in FIG. 6A is different from the drive operations according to the operational mode for expanding the dynamic range illustrated in FIGS. 4A and 4B in the following points. In the sampling drive operation SD illustrated in FIG. 6A, the image pickup apparatus 100 supplies the signal TS2 and the signal TN at substantially the same timing before performing the reading drive operations READ S1 to READ SN after supplying the signal TS1. More specifically, after the first signal is held by the first holding unit SH1 and before the first signal is output from the first holding unit SH1, a signal is held by the second holding unit SH2 in a period during which the offset signal of the amplification unit AP can be held by the third holding unit SH3. The signal held by the second holding unit SH2 is an offset signal reflecting the temperature dependency depending on a difference between the second holding unit SH2 and the third holding unit SH3 with respect to the distance from the amplification unit AP. The second output unit OP2 outputs the second output signal based on the offset signal. The image pickup apparatus 100 reads an image signal S1-D1 based on the first signal in the reading drive operation READ S1, and reads an image signal S2-D1 based on the second output signal in the reading drive operation READ S2. Further, the image pickup apparatus 100 reads an image signal SN-D1 based on the third output signal in the reading drive operation READ SN. Then, the correction unit 110 corrects the image signal S1-D1 based on the first signal with reference to the image signal S2-D1 based on the second output signal and the image signal SN-D1 based on the third output signal.

As an example of the correction, the correction unit 110 performs first differential processing to be applied to the image signal S1-D1 and the image signal SN-D1 for each pixel P. However, the first differential processing is not so effective to reduce the temperature dependency included in the offset signal depending on the difference between the first holding unit SH1 and the third holding unit SH3 with respect to the distance from the amplification unit AP. Further, the correction unit 110 performs second differential processing to be applied to the image signal S2-D1 and the image signal SN-D1. Through the second differential processing, the temperature dependency included in the offset signal depending on the difference in distance between the second holding unit SH2 and the third holding unit SH3 can be calculated. Then, the correction unit 110 performs differential processing to be applied to the first differential processing result and the second differential processing result. Therefore, the temperature dependency included in the image signal S1-D1, included in the offset signal depending on the difference in distance between the first holding unit SH1 and the third holding unit SH3, can be suppressed. However, any other method is usable when the correction unit 110 performs correction processing if the method is useful to obtain the offset signal reflecting the temperature dependency through differential processing applied to the image signal S1-D1.

The processing according to the first exemplary embodiment is not limited to the example illustrated in FIG. 6A. FIG. 6B illustrates other example characterized by using the second signal held by the second holding unit SH2 based on the signal TS2 in the reset drive operation RD and the offset signal held by the third holding unit SH3 based on the signal TN in the reset drive operation RD. More specifically, the second output signal is based on a signal held by the second holding unit SH2 in a period during which the conversion unit CP and the amplification unit AP can be reset by the reset unit RP. In this case, it is unnecessary to supply the signal TS2 and the signal TN in the sampling drive operation SD. According to the above-mentioned example, appropriately suppressing the temperature dependency is possible, for example, by using an image signal obtainable as an arithmetic mean of the image signal S2-D1 and an image signal S2-D2 and an image signal obtainable as an arithmetic mean of the image signal SN-D1 and an image signal SN-D2 in the correction of the image signal S1-D1. FIG. 6C illustrates other example characterized by supplying none of the signal TS2 and the signal TN in the reset drive operation RD. In this case, resetting the second holding unit SH2 and the third holding unit SH3 in the reset drive operation RD can be replaced by holding the offset signal in the second holding unit SH2 and the third holding unit SH3 in the sampling drive operation SD. In this case, it is useful to perform the correction described with reference to FIG. 6A.

Figure 7C:
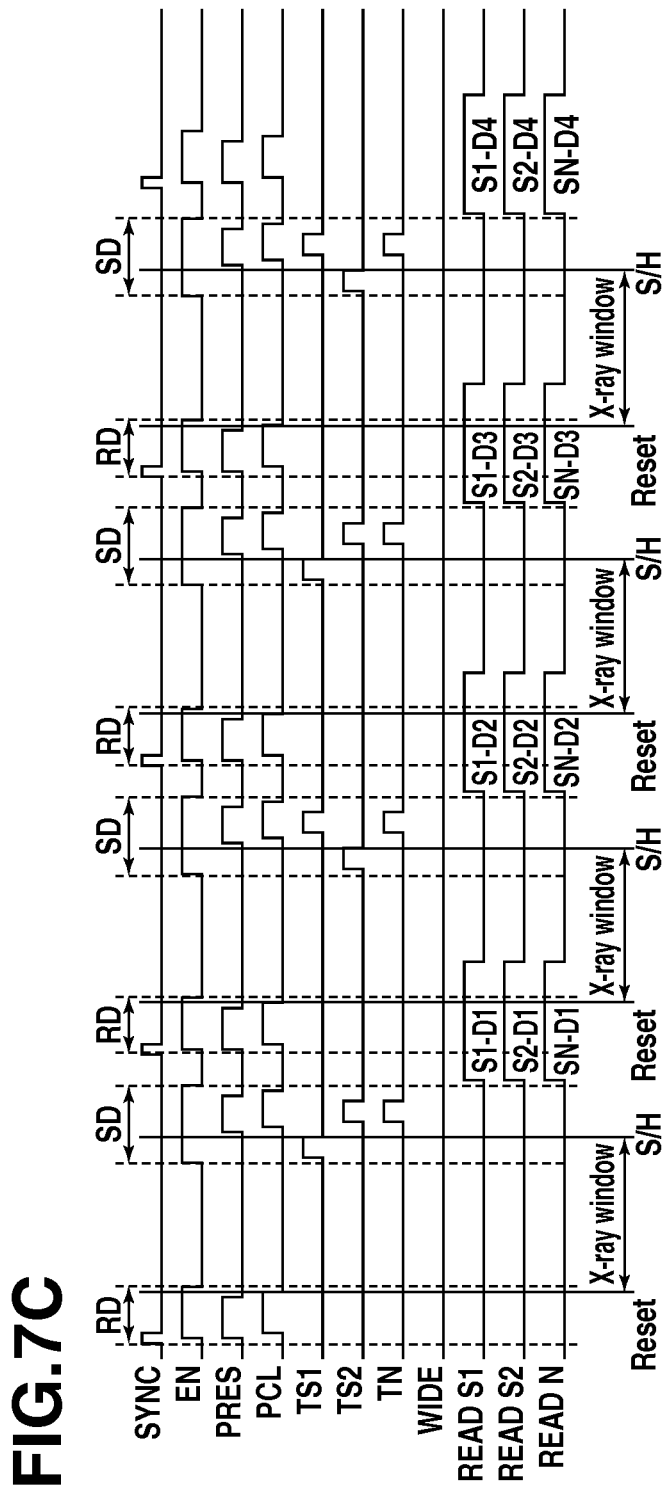

Next, other examples of the processing that can be realized by the image pickup apparatus according to the first exemplary embodiment will be described in detail below with reference to timing charts illustrated in FIGS. 7A to 7C. The example illustrated in FIG. 7A is different from the drive operations illustrated in FIG. 6A in the following points. According to the sequence illustrated in FIG. 7A, in the sampling drive operation SD of an even number of frame, the first signal is held in the second holding unit SH2 in response to the signal TS2 and the signals TS1 and TN are supplied at substantially the same timing. More specifically, the first output signal based on the offset signal reflecting the temperature dependency, held by the first holding unit SH1 in response to the signal TS1, is used in the correction. Then, the correction unit 110 corrects the image signal S1-D1 based on the first signal read out in the reading drive operation READ S1 with reference to an image signal S1-D2 based on the first output signal. More specifically, the correction unit 110 corrects the first signal with reference to the first output signal and the third output signal. The above-mentioned correction is useful to suppress the temperature dependency included in the offset signal, for example, even between the first holding unit SH1 and the second holding unit SH2, or even in a case where there is differences in the distance from the amplification unit AP and the influence of temperature change depending on the distance.

The correction unit 110 can perform the above-mentioned correction to correct, for example, an image signal S1-D3 of the third frame with reference to an image signal S1-D4 of the fourth frame. In such a case, the image signal S1-D4 based on the first output signal is based on a signal held by the first holding unit SH1 after the image signal S1-D3 based on the first signal has been output from the first holding unit SH1 and in a period during which the offset signal of the amplification unit AP can be held by the third holding unit SH3.

Further, the correction unit 110 can perform the above-mentioned correction to correct, for example, an image signal S1-D3 of the third frame with reference to an image signal S1-D2 of the second frame. In such a case, the image signal S1-D2 based on the first output signal is based on a signal held by the first holding unit SH1 before the first signal (from which the image signal S1-D3 can be derived) is held by the first holding unit SH1 in a period during which the offset signal of the amplification unit AP can be held by the third holding unit SH3. In such a case, signals from which image signals to be used can be derived will be held by the holding unit at different the timings. For example, in a case where the frame rate is 30 fps or 60 fps, temporal difference will be short (e.g., 15 to 30 ms) and there will be no problem.

Further, the correction unit 110 can perform the above-mentioned correction to correct, for example, an image signal S1-D3 of the third frame with reference to an arithmetic mean of the image signal S1-D2 of the second frame and the image signal S1-D4 of the fourth frame. In such a case, it is possible to appropriately suppress the temperature variation amount based on the temporal difference. In this case, it is desired to use an offset signal that has been obtained together with the target image signal to be subjected to the correction in the same sampling operation SD. Alternatively, is also possible to use an offset signal appropriately selected according to the image signal to be used in the correction.

However, the processing according to a second exemplary embodiment is not limited to the example illustrated in FIG. 7A. For example, FIG. 7B illustrates other example characterized by supplying none of the signal TS1, the signal TS2, and the signal TN in the reset drive operation RD. In such a case, as illustrated in FIG. 7C, the image pickup apparatus 100 can perform the reset drive operation RD in a period during which the reading drive operations READ S1 to READ SN can be performed and can further increase the frame rate. Further, as illustrated in FIG. 8A, it is possible to omit the reset drive operation RD. In such a case, it becomes possible to increase the frame rate greatly, compared to the example illustrated in FIG. 7C. Further, as illustrated in FIG. 8B, it is possible to set the signal WIDE to High level constantly to use the signal obtainable from the conversion unit CP having the low sensitivity.

The present invention is not limited to the above-mentioned exemplary embodiments. For example, the present invention can be realized by any other exemplary embodiment if it is possible to perform correction processing for reducing the differences in the noise components, which derive from differences in the influence of the heat of the amplification unit imparted on the signal holding unit and the influence imparted on the offset holding unit. For example, it is possible to measure the temperature of each element with a temperature sensor, hold a data representing an offset component in association with the temperature of each element beforehand, and perform correction processing on each signal with reference to the stored data.

Further, the present invention can be realized by the following processing. More specifically, the processing includes supplying a program capable of realizing at least one of the functions of the above-mentioned exemplary embodiments to a system or an apparatus via a network or a storage medium and causing at least one processor of a computer provided in the system or the apparatus to read and execute the program. Further, the present invention can be realized by a circuit (e.g., ASIC) capable of realizing at least one of the functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-208407, filed Oct. 9, 2014, which is hereby incorporated by reference herein in its entirety.

What is claimed is:

1. An image pickup apparatus, comprising:
a pixel array including a plurality of pixels arranged in a two-dimensional pattern, each of the pixels includes a conversion unit configured to convert radiation or light into an electric charge, an amplification unit configured to amplify the electric charge, a first holding unit configured to hold a first signal obtained by the amplification unit amplifying the electric charge converted by the conversion unit having a first sensitivity, a second holding unit configured to hold a second signal obtained by the amplification unit amplifying the electric charge converted by the conversion unit having a second sensitivity different from the first sensitivity, and a third holding unit configured to hold an offset signal of the amplification unit; and
a correction unit configured to correct the first signal using a second output signal output from the second holding unit or a first output signal output from the first holding unit, and a third output signal output from the third holding unit.

2. The image pickup apparatus according to claim 1, wherein the correction unit is configured to correct the first signal using the first output signal and the third output signal.

3. The image pickup apparatus according to claim 2, wherein the first output signal is based on a signal held by the first holding unit in a period of time during which the offset signal of the amplification unit is held by the third holding unit, after the first signal is outputted from the first holding unit.

4. The image pickup apparatus according to claim 2, wherein the first output signal is based on a signal held by the first holding unit in a period of time during which the offset signal of the amplification unit is held by the third holding unit, before the first signal is held by the first holding unit.

5. The image pickup apparatus according to claim 2, wherein the first output signal is based on a signal held by the first holding unit in a period of time during which the offset signal of the amplification unit is held by the third holding unit after the first signal is outputted from the first holding unit, and a signal held by the first holding unit in a period of time during which the offset signal of the amplification unit is held by the third holding unit before the first signal is held by the first holding unit.

6. The image pickup apparatus according to claim 1, wherein the correction unit is configured to correct the first signal using the second output signal and the third output signal.

7. The image pickup apparatus according to claim 6, wherein the second output signal is based on a signal held by the second holding unit in a period of time during which the offset signal of the amplification unit is held by the third holding unit, after the first signal is held by the first holding unit and before the first signal is outputted from the first holding unit.

8. The image pickup apparatus according to claim 7, wherein the pixel further includes a reset unit configured to reset the conversion unit and the amplification unit, and wherein the second output signal is based on a signal held by the second holding unit in a period of time during which a photoelectric conversion element and the amplification unit are reset by the reset unit.

9. The image pickup apparatus according to claim 1, further comprising a control unit configured to control an operation for holding the first signal in the first holding unit, an operation for holding the second signal in the second holding unit, and an operation for holding the offset signal in the third holding unit, simultaneously for the plurality of pixels arranged in the pixel array.

10. The image pickup apparatus according to claim 9, wherein the pixel further includes a first output unit configured to output the first output signal from the first holding unit, a second output unit configured to output the second output signal from the second holding unit, and a third output unit configured to output the third output signal from the third holding unit, and
wherein the control unit is configured to control output processing by the first output unit, output processing by the second output unit, and output processing by the third output unit in such a way as to generate a first image signal by sequentially outputting the first output signal from the plurality of pixels arranged in the pixel array, generate a second image signal by sequentially outputting the second output signal from the plurality of pixels arranged in the pixel array, and generate a third image signal by sequentially outputting the third output signal from the plurality of pixels arranged in the pixel array.

11. The image pickup apparatus according to claim 10, wherein the conversion unit includes a conversion element configured to convert radiation or light into an electric charge, an additional capacitance, and a transistor disposed between the conversion element and the additional capacitance to switch the sensitivity of the conversion element between the first sensitivity and the second sensitivity,
wherein the amplification unit includes a first amplifying transistor configured to output a voltage obtained by amplifying the electric charge of the conversion element, a first control transistor configured to control an operational state of the first amplifying transistor, a second amplifying transistor configured to output a voltage obtained by amplifying the voltage output from the first amplifying transistor, a clamp capacitor serially connected to the first amplifying transistor and the second amplifying transistor between the first amplifying transistor and the second amplifying transistor, and a second control transistor configured to control an operational state of the second amplifying transistor, and
wherein the reset unit includes a first reset transistor configured to provide a predetermined potential to the conversion element and a second reset transistor configured to provide a predetermined potential to a connection node between the clamp capacitor and the second amplifying transistor.

12. The image pickup apparatus according to claim 11, wherein the control unit is configured to control a clamp operation for holding the offset of the first amplifying transistor in the clamp capacitor by causing the second reset transistor to complete providing the predetermined potential to the connection node after the first reset transistor completes providing the predetermined potential to the conversion element, and perform the clamp operation for the plurality of pixels arranged in the pixel array simultaneously.

13. The image pickup apparatus according to claim 12, wherein the first holding unit includes a first transfer transistor configured to transfer the voltage output from the second amplifying transistor, and a first holding capacitor for holding the voltage transferred by the first transfer transistor,
wherein the second holding unit includes a second transfer transistor configured to transfer the voltage output from the second amplifying transistor, and a second holding capacitor for holding the voltage transferred by the second transfer transistor, and
wherein the third holding unit includes a third transfer transistor configured to transfer the voltage output from a third amplifying transistor, and a third holding capacitor for holding the voltage transferred by the third transfer transistor.

14. The image pickup apparatus according to claim 13, wherein the first output unit includes a first signal amplifying transistor configured to output a signal obtained by amplifying the voltage held by the first holding capacitor, and a first output switch configured to output a first signal or the first output signal from the pixel by transferring the signal output from the first signal amplifying transistor,
wherein the second output unit includes a second signal amplifying transistor configured to output a signal obtained by amplifying the voltage held by the second holding capacitor, and a second output switch configured to output a second output signal from the pixel by transferring the signal output from the second signal amplifying transistor, and
wherein the third output unit includes a third signal amplifying transistor configured to output a signal obtained by amplifying the voltage held by the third holding capacitor, and a third output switch configured to output a third output signal from the pixel by transferring the signal output from the third signal amplifying transistor.

15. The image pickup apparatus according to claim 11, wherein the conversion element includes a wavelength conversion member configured to convert the radiation into light and a photoelectric conversion element configured to convert the light into the electric charge.

16. A radiation image pickup system, comprising:
the image pickup apparatus according to claim 1;
a processing apparatus configured to process a signal received from the image pickup apparatus; and
a radiation generating apparatus configured to generate radiation travelling toward the image pickup apparatus.

17. An image pickup apparatus, comprising:
a pixel array including a plurality of pixels arranged in a two-dimensional pattern, each of the pixels including a conversion unit configured to convert radiation or light into an electric charge, an amplification unit configured to amplify the electric charge, and first, second and third holding units configured to hold a signal from the amplification unit separately from each other; and
a correction unit configured to correct a signal obtained by the amplification unit amplifying the electric charge converted by the conversion unit and held by the first holding unit, using a second output signal output from the second holding unit or a first output signal output from the first holding unit, and a third output signal output from the third output signal.

18. A radiation image pickup system comprising:
the image pickup apparatus according to claim 17;

a processing apparatus configured to process a signal received from the image pickup apparatus; and a radiation generating apparatus configured to generate radiation travelling toward the image pickup apparatus.

* * * * *